United States Patent [19]

Anthony et al.

[11] Patent Number: 4,573,156
[45] Date of Patent: Feb. 25, 1986

[54] SINGLE MODE LASER EMISSION

[75] Inventors: Philip J. Anthony, Bridgewater; Eugene I. Gordon, Convent Station, both of N.J.

[73] Assignee: AT&T Bell Laboratories, Murray Hill, N.J.

[21] Appl. No.: 532,777

[22] Filed: Sep. 16, 1983

[51] Int. Cl.[4] .............................................. H01S 3/098
[52] U.S. Cl. .......................................... 372/19; 372/20; 372/44; 372/92; 372/99; 350/1.7; 350/166
[58] Field of Search ...................... 372/18–20, 372/43, 44, 45, 96, 98, 101, 99, 92; 350/1.6, 1.7, 163, 164, 166, 288, 311

[56] References Cited

U.S. PATENT DOCUMENTS

| | | | |
|---|---|---|---|
| 3,645,600 | 2/1972 | Doctoroff et al. | 350/1.7 |
| 3,799,654 | 3/1974 | Donne | 350/166 |
| 4,009,453 | 1/1977 | Mahlein | 372/99 |
| 4,408,825 | 10/1983 | Stelmack | 350/1.7 |

OTHER PUBLICATIONS

"Reflection and Transmission Interference Filters," L. N. Hadley et al., *Journal of Optical Society of America*, vol. 37, p. 451, (1947), and vol. 38, p. 483, (1948).
"Tunable Metal Film Filters as Narrowband IR Laser Reflectors," W. R. Leeb, *Applied Optics*, vol. 15, No. 3, pp. 681–689, (Mar. 1976).
"$CO_2$ Laser Line Selection with Metal Film Reflector," W. R. Leeb, *AEU Archive Elek. Ueber*, vol. 32, pp. 186–190, (1978).

Primary Examiner—William L. Sikes
Assistant Examiner—Léon Scott, Jr.
Attorney, Agent, or Firm—Lester H. Birnbaum

[57] ABSTRACT

Disclosed is an optical device producing single mode laser emission. The device includes a semiconductor laser which would normally emit a number of closely spaced longitudinal modes and a filter which receives light from the laser active layer and reflects light back to the active layer. The filter includes at least one thin, optically absorbing layer, a dielectric layer, and a reflecting layer. The thickness and refractive indices of the layers are such that the filter reflectivity has a number of narrow maxima, but only one which lies within the gain bandwidth of the laser. The width of the peak and the background amplitude between peaks is such that only a single longitudinal mode of the laser is allowed to oscillate.

10 Claims, 3 Drawing Figures

SINGLE MODE LASER EMISSION

BACKGROUND OF THE INVENTION

This invention relates to an optical device for achieving single longitudinal mode laser emission.

At present, great interest is being directed to the production of single longitudinal mode (single wavelength) light output from a semiconductor laser. One single wavelength technique, known as distributed Bragg reflection (DBR), is achieved by periodic waveguide reflection or waveguide grating reflection as an alternative to Fresnel reflection from the facets of a semiconductor laser. Light in a narrow frequency band is reflected from the gratings back into the laser active layer thereby selecting a longitudinal mode within the reflection band for oscillation from the multiple longitudinal modes which would normally oscillate within the gain bandwidth of the laser. In another form of Bragg reflection, a grating may be supplied external to the laser rather than as an integrated portion of the semiconductor.

Another class of techniques for achieving single frequency oscillation is based on the use of coupled optical cavities. The resonant frequencies of the two (or more) cavities are such that only one oscillation frequency is allowed within the gain bandwidth of the laser. Recently, a promising version of this approach has been suggested where the two cavities are achieved by cleaving a standard two-mirror laser diode and introducing an internal reflection surface. The cavities are also electrically isolated so that the wavelength can be adjusted by changing the optical length of the cavities by varying the current to one or both cavities. (See, U.S. patent application of W. Tsang, Ser. No. 482,964, filed Apr. 8, 1983, and assigned to the present assignee.) While this approach appears to be an excellent solution to the problem of producing single-mode emission, it, like the DBR laser, requires modification of the simple two-mirror laser diode. Another approach is the use of a Fabry-Perot interferometer provided external to the laser structure so that light reflected by the interferometer onto the laser will closely match only one mode of the laser. One difficulty with this technique is the fact that the interferometer provides a fairly broad band, weakly-wavelength-dependent, reflection which may result in instabilities in the mode selection.

It is desirable, as an alternative, to provide a relatively simple, external, passive element which will reflect efficiently in only a narrow wavelength band so that when coupled to a facet of a simple laser diode, the laser will be constrained to emit at only a single frequency. Although narrow band reflective filters have been proposed for selection of lasing lines and modes in a $CO_2$ laser, apparently no one has previously taught how single mode emission can be produced from a multimode semiconductor laser with a reflective filter. (See, for example, Leeb, "Tunable Metal Film Filters as Narrow Band IR Laser Reflectors," *Applied Optics*, Vol. 15, No. 3, pp. 681–689 (March 1976) and Leeb, "$CO_2$ Laser Line Selection With Metal Film Reflector," *AEU Archive Elek. Ueber*, Vol. 32, pp. 186–190 (1978).)

It is therefore a primary object of the invention to provide an optical device comprising a semiconductor laser and filter combination which is capable of producing single-mode emission.

SUMMARY OF THE INVENTION

These and other objects are achieved in accordance with the invention which is an optical device for producing single longitudinal mode laser emission. The device comprises a semiconductor laser having an active area between first and second cleaved surfaces from which light is emitted and a spacing between cleaved surfaces such that multiple longitudinal modes would normally be generated within the gain bandwidth of the laser. The device further comprises an optical reflecting filter which receives light from one of said surfaces and reflects light back to the active region. The filter comprises a reflecting layer spaced from said one of the cleaved surfaces, at least one thin, optically absorbing layer between the said cleaved surface and reflecting layer, and at least one dielectric layer between the absorbing layer and the reflecting layer. The thicknesses and indices of refraction of the absorbing and dielectric layers are such that the reflectivity characteristic of the filter is capable of causing laser oscillation of only a single longitudinal mode.

BRIEF DESCRIPTION OF THE DRAWING

These and other features of the invention are delineated in detail in the following description. In the drawing.

It will be appreciated that for purposes of illustration, these Figures are not necessarily drawn to scale.

DETAILED DESCRIPTION

Figure 1:
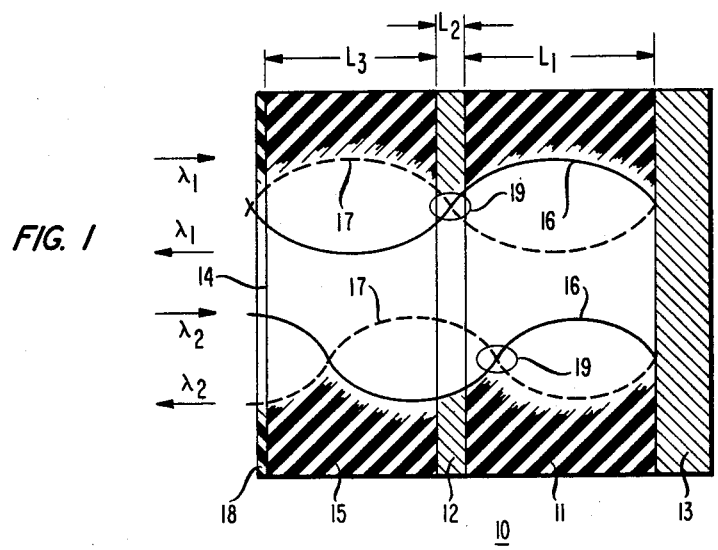
FIG. 1 is a cross-sectional, schematic view of a filter used in accordance with one embodiment of the invention.

The basic features of the invention will now be described in accordance with the embodiments illustrated in FIGS. 1 and 2. FIG. 1 shows, in cross-section, a filer, 10, with a surface, 14, at one end for receiving input light and transmitting light which is reflected by reflecting layer, 13. This surface, 14, should preferably have an antireflection layer structure, 18, appropriate to the dielectric constant of the medium to which it is applied such as magnesium fluoride. Between the surface, 14, and the layer, 13, is a thin, optically absorbing layer, 12, having a thickness $L_2$ and a complex refractive index $N_2$. Between the absorbing and reflecting layers is an optically transparent dielectric layer, 11, which in this example is in direct contact with one surface of each layer, 12 and 13. The dielectric layer, 11, has a thickness $L_1$ and a real refractive index $N_1$. In contact with the surface of layer, 12, opposite to dielectric, 11, is another optically transparent layer, 15, which in this example is the same material as 11 but has a length $L_3$ which is not necessarily the same as $L_1$. The surface of the layer, 15, which is opposite the absorbing layer comprises the surface, 14, for receiving the light input and transmitting the reflected light. Alternatively, layer, 15, and the antireflection coating, 18, may be omitted in the structure so that the surface, 14, can be the surface of the absorbing layer, 12.

The thicknesses and refractive indices of the dielectric and absorbing layers are chosen so that when broadband radiation is incident on surface, 14, the reflected radiation from layer, 13, emerging from surface, 14, will have peak amplitudes only at certain selected frequencies.

The manner in which this is accomplished is illustrated schematically in FIG. 1 which shows the simplest form of the filter with the thinnest dielectric layer, 11, producing the desired result (in general, the dielectric will be much thicker). The reflecting layer, 13, preferably has close to 100% reflectivity. The superposition of incident and reflected waves of each wavelength produces standing wave patterns such as those shown by the solid and dashed lines, 16 and 17, for wavelengths $\lambda_1$ and $\lambda_2$. However, only those wavelengths, such as $\lambda_1$ which have a node, 19, falling within the thin absorbing layer will have undiminished reflectivity relative to that provided by reflecting layer, 13. Other wavelengths, such as $\lambda_2$, will have a nonzero standing wave amplitude falling within the absorbing layer and so will experience some loss. Thus, a plurality of reflectivity peaks will be produced by the filter at specific wavelengths depending upon the refractive indices of layers, 11, 12, 13 and 15, and on the thicknesses of layers, 11 and 12. (For a detailed discussion of this type of filter, see Hadley and Dennison, "Reflection and Transmission Interference Filters," *Journal of Optical Society of America*, Vol. 37, page 451 (1947) and Vol. 38, page 483 (1948).)

In order to accurately analyze the reflectivity characteristics of such a filter, it will be appreciated that the refractive indices as well as the radiation impedances of layers, 12 and 13 have a real and imaginary part. It can be shown that the complex amplitude reflectivity, r, for a plane wave incident normal to the filter surface is given by:

$$r = \frac{A + B/Z_t - CZ_d - D(Z_d/Z_t)}{A + B/Z_t + CZ_d + D(Z_d/Z_t)} \quad (1)$$

where $Z_t$ is the radiation impedance of the reflecting layer (13) and $Z_d$ is the radiation impedance of the dielectric layers (11 and 15). The complex parameters A, B, C and D are defined as the components of a matrix $\overline{M}\overline{M}_s$ in the form $$\overline{M}_s = \begin{vmatrix} A & B \\ C & D \end{vmatrix} \quad (2)$$

This matrix, $\overline{M}_s$, is determined by a matrix multiplication of the characteristic matrix, $\overline{M}_j$, of each layer (in this case, layers, 11 and 12, which is $$\overline{M}_j = \begin{vmatrix} \cos\phi_j & iZ_j\sin\phi_j \\ iZ_j^{-1}\sin\phi_j & \cos\phi_j \end{vmatrix} \quad (3)$$

where $\phi_j$ is the phase shift through the layer and $Z_j$ is the radiation impedance for the layer.

The phase shift $\phi_j$ through a layer is determined by the expression:

$$\phi_j = \frac{2\pi L_j N_j}{\lambda} \quad (4)$$

where $L_j$ is the thickness of the layer, $N_j$ is the complex index of refraction of the layer, and $\lambda$ is the wavelength of the incident light.

The characteristic radiation impedance of a layer, $Z_j$, is determined by:

$$Z_j = \frac{Z_d N_d}{N_j} \quad (5)$$

where $N_d$ is the refractive index of the dielectric layers, 11 and 15.

Thus, using this analysis, it is possible to calculate the reflectivity for given configurations from the layer thicknesses and indices of refraction and evaluate their utility. We have discovered, in fact, that it is possible to achieve reflectivity peak widths and separations sufficient to select a single longitudinal mode of a semiconductor laser.

Figure 2:
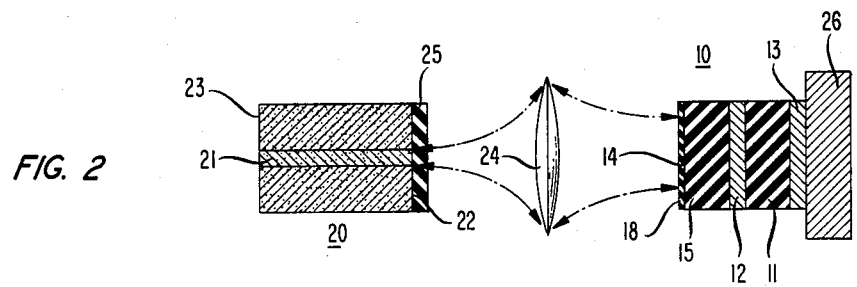
FIG. 2 is a cross-sectional schematic view of a laser and filter combination in accordance with an embodiment of the invention.

The filter illustrated in FIG. 1 may be combined with a semiconductor laser as shown in FIG. 2. The laser, 20, can be any standard semiconductor laser such as an InGaAsP multilayer structure, which includes an active layer, 21, in which the light is generated. The laser also includes cleaved, optically flat, end surfaces (facets), 22 and 23. An antireflection coating, 25, is provided on surface, 22. As shown in FIG. 2, the filter can be spaced from the laser and the light emerging from surface, 22, collimated by lens, 24, and made incident on the input surface, 14, of the filter. The reflected light from the filter is therefore also focused by lens, 24, back into the active region, 21. Preferably, the light from the laser is focused by lens, 24, so that the beam waist is located at the surface of reflecting layer, 13. Thus, the beam is "collimated" in the sense that the Rayleigh range of the beam is large compared with the longitudinal dimension of the filter.

The combination of laser, 20, and filter, 10, will produce single mode emission of light from surface, 23, which would otherwise comprise multimode emission if the laser alone were utilized, by an appropriate choice of thicknesses and indices of refraction for the absorbing, dielectric and reflective layers.

In a particular example, the semiconductor laser was an InGaAsP heterostructure laser emitting at a wavelength of 1.3 $\mu$m with an 8 Angstrom mode spacing. The dielectric layer, 11, was glass with a refractive index of 1.5. The thickness, $L_1$, of layer, 11, was 70 $\mu$m. The reflecting layer, 13, was gold with a thickness of greater than 1,000 Angstroms and an index of refraction at 1.3 $\mu$m of 0.69–j7.3. Layers, 15 and 18, were omitted in this example. The laser cavity (the distance from surface, 23, to reflecting layer, 13) was approximately 10 cm with the lens spaced approximately 2 cm from laser surface, 22, and approximately 8 cm from filter surface, 14.

Particularly critical in achieving the proper reflectivity characteristics is the choice of a material and thickness for the absorbing layer. We have found that platinum is preferred due to the high quality of platinum evaporated thin films and the fact that the imaginary component of the index of refraction (7.3 at 1.3 $\mu$m) is not too much higher than the real component (4.2). This allows a practical thickness of less than approximately $\lambda/10$ that still gives sufficient absorption for unwanted modes. The thickness of layer, 12, was approximately 250 Angstroms in order to give a sufficiently sharp reflectivity peak while keeping the background reflectivity between peaks at a sufficiently low level to permit mode selection.

Figure 3:
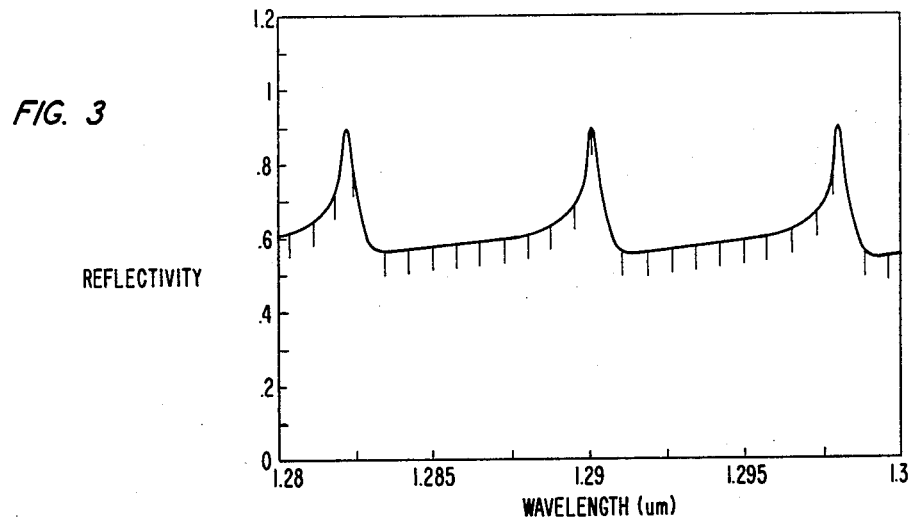
FIG. 3 is a graph of the reflectivity of the light from the filter of FIG. 1 as a function of wavelength with laser mode spacing superimposed thereon.

In FIG. 3, a portion of the reflectivity curve of the filter is shown with the cavity mode spacing as indicated by the vertical lines superimposed thereon. The gain bandwidth of the laser in this example extended from −50 Angstroms to +50 Angstroms relative to the middle reflectivity peak shown. Only the middle peak affected the stimulated emission of the laser since adjacent peaks were outside the gain bandwith at a spacing of approximately 80 Angstroms. The particular mode emitted by the laser at 1.29 μm is the one at or near the maximum of the reflectivity. All other modes will be suppressed provided there is a sufficient difference between the peak reflectivity and the reflectivity at the wavelengths coinciding with the other modes. In this example, the peak reflectivity was 0.9 and the reflectivity at the adjacent mode was 0.7. It is recommended for proper selection that the difference in reflectivity be at least 5%. The spacing of the peaks is preferably at least 50 Angstroms for proper mode selection. The width of the peak should be no greater than 10 Angstroms. In certain applications, these limits could be violated with some sacrific in stability.

It should be appreciated that, while increasing the thickness of layer, 12, will narrow the peak width, the background reflectivity corresponding to the other modes will also increase. Thus, the choice of a specific thickness will depend on particular needs. In general, it is recommended that the thickness of layer, 12, be within the range 100–500 Angstroms.

The antireflection coating, 25, which in this example was Al$_2$O$_3$, is desirable since it prevents ripples in the reflectivity which could produce jumping between modes. The higher the reflectivity difference between the peaks and background in FIG. 3, the more the reflectivity that can be tolerated at the laser surface, 22. In general, a reflectivity of less than 1% is recommended and less than 0.1% is preferred.

The invention is probably most useful with an InGaAsP laser emitting at a wavelength in the range 1.2–1.6 μm and having a mode spacing in the range 1–100 Angstroms.

Thus, in summary, a filter, 10, can be designed to achieve sufficiently sharp reflectivity peaks at sufficient wavelength separations so that the light reflected from the filter into a semiconductor laser, 20, will cause oscillation of only a single mode even though the modes which the laser would ordinarily emit are very closely spaced.

The frequency stability of the device in accordance with the invention can be enhanced by providing means for tuning the reflectivity peaks. This can be done, for example, by varying the temperature of the dielectric layer, 11, through an appropriate heat sink, illustrated schematically as layer, 26, against the reflecting layer. Alternatively, layer, 11, could be a piezoelectric or birefringent material and a voltage could be applied to metals, 12 and 13, to vary the phase shift of the light through the layer and thereby move the reflectivity peaks to track drifting modes. Selectivity and separation between maximum can also be enhanced by providing a plurality of dielectric layers such as 11, with absorbing layers such as 12 sandwiched therebetween. Since it is desirable to have the peaks far enough apart so that only one overlaps the gain bandwidth of the laser, it may in fact be preferable to provide such additional layers since the spacing between peaks can be varied thereby without changing the width of the peaks.

In such cases, the total thickness of all dielectric and absorbing layers would remain the same as previously specified for single layers, 11 and 12, (approximately 70 μm) but each individual dielectric would be proportionately thinner while each individual absorbing layer would have the same thickness. In general, the total thickness of dielectric and absorbing layers should be within the range 50–100 μm.

Various additional modifications of the invention will become apparent to those skilled in the art. All such variations which basically rely on the teachings through which the invention has advanced the art are properly considered within the spirit and scope of the invention.

What is claimed is:

1. An optical device for producing single longitudinal mode laser light emission comprising:

a semiconductor laser having an active area between first and second cleaved surfaces from which light is emitted and a spacing between cleaved surfaces such that multiple longitudinal modes would normally be generated within the gain bandwidth of the laser; and an optical filter which receives light from one of said surfaces and reflects light back to the laser, the filter comprising a reflecting layer spaced from said one of the cleaved surfaces, at least one thin, optically absorbing layer between said cleaved surface and reflecting layer, and at least one dielectric layer between the absorbing layer and the reflecting layer, the thicknesses and indices of refraction of the absorbing and dielectric layers being such that the reflectivity characteristic of the filter has only one peak within the gain bandwidth of the laser and is capable of causing laser oscillation of only a single mode within that bandwidth when the reflected light is incident on the laser.

2. The device according to claim 1 wherein, a lens is provided between the laser and filter to collimate the light from the said cleaved surface, and an antireflection coating is provided on said cleaved surface.

3. The device according to claim 1 wherein the absorbing layer comprises platinum with a thickness of 100–500 Angstroms.

4. The device according to claim 1 wherein the laser comprises InGaAsP spontaneously emitting light at a wavelength of 1.2–1.6 μm and the laser cavity has a mode spacing of 1–100 Angstroms.

5. The device according to claim 1 wherein the reflectivity has a difference of at least 5% between the peak and a value at a wavelength difference corresponding to the mode spacing of the laser cavity.

6. The device according to claim 1 wherein the peaks of the reflectivity are spaced at least 50 Angstroms apart.

7. The device according to claim 1 wherein the width of the reflectivity peak is no greater than 10 Angstroms.

8. The device according to claim 1 further comprising means for shifting the reflectivity peak.

9. The device according to claim 1 wherein the dielectric layer comprises glass and the reflecting layer comprises gold.

10. An optical device for producing single-mode laser light emission comprising:

a semiconductor laser having an active area comprising InGaAsP with a gain bandwidth of 100 Angstroms and normally emitting multiple longitudinal modes, said laser having first and second cleaved surfaces from which said light is emitted;

an antireflection coating formed on one of said cleaved surfaces;

an optical filter which is spaced from the said antireflection coated surface and which receives light from said surface and reflects light back to the laser, the filter comprising a first antireflection coated surface for receiving the laser light and transmitting the reflected light, a reflecting layer comprising gold spaced from the first surface, at least one layer of platinum having a thickness in the range 100–500 Angstroms spaced between said first surface and gold layer, and at least one layer comprising glass between the platinum layer and gold layer, the thicknesses and indices of refraction of the layers being such that the reflectivity characteristic has a plurality of amplitude peaks spaced at least 50 Angstroms apart and having a width of less than 10 Angstroms with only one of said peaks at a wavelength which is within the gain bandwidth of the laser and the difference between the maximum amplitude and the amplitude at a wavelength difference corresponding to the mode spacing of the cavity is at least 5%; and a lens positioned between said cleaved surface and the first surface of the filter for collimating light from the laser and focusing light from the filter onto the laser.

* * * * *